(12) United States Patent
Brombach et al.

(10) Patent No.: US 7,719,811 B2
(45) Date of Patent: May 18, 2010

(54) FET MONITORING AND PROTECTING SYSTEM

(75) Inventors: Ronald Brombach, Plymouth, MI (US); Karl Wojcik, Sterling Heights, MI (US); Jim Weinfurther, Farmington, MI (US); Brian Tian, Novi, MI (US)

(73) Assignee: Ford Global Technologies, Dearborn, MI (US)

( * ) Notice: Subject to any disclaimer, the term of this patent is extended or adjusted under 35 U.S.C. 154(b) by 0 days.

(21) Appl. No.: 11/530,292

(22) Filed: Sep. 8, 2006

(65) Prior Publication Data

US 2008/0062604 A1 Mar. 13, 2008

(51) Int. Cl.
*H02H 9/02* (2006.01)
(52) U.S. Cl. .................................. 361/93.1; 361/93.2
(58) Field of Classification Search ............. 361/93.1, 361/93.2
See application file for complete search history.

(56) References Cited

U.S. PATENT DOCUMENTS

| 5,627,717 | A | 5/1997 | Pein et al. |
|---|---|---|---|
| 5,798,576 | A * | 8/1998 | Ostermann et al. ......... 307/10.3 |
| 5,914,545 | A | 6/1999 | Pollersbeck |
| 5,986,359 | A | 11/1999 | Enderick et al. |
| 5,994,790 | A * | 11/1999 | Nagashima et al. ........ 307/10.1 |
| 6,107,926 | A | 8/2000 | Kifuku et al. |
| 6,373,671 | B1 | 4/2002 | Watanabe et al. |
| 6,788,514 | B2 | 9/2004 | Balakrishnan |

* cited by examiner

*Primary Examiner*—Fritz M. Fleming
*Assistant Examiner*—Lucy Thomas
(74) *Attorney, Agent, or Firm*—Angela M. Brunetti; Frank MacKenzie

(57) ABSTRACT

A FET monitoring and protecting system (10) that includes a FET switch device (20). The FET switch device (20) includes a FET (22), a logic device (57), and a feedback status output (26). The logic device (57) is electrically coupled to the FET (22) and generates a feedback status signal. A counter (60) is incremented in response to an actual short circuit condition of the FET switch device (20). A controller (18) is electrically coupled to the feedback status output (26). The controller (18) permits the activation of the FET (22) in response to the feedback status signal and a value of the counter (60).

20 Claims, 7 Drawing Sheets

FET MONITORING AND PROTECTING SYSTEM

TECHNICAL FIELD

The present invention relates to vehicle electronic and electrical systems and components. More particularly, the present invention is related to the monitoring and protecting of FETs and FET circuits.

BACKGROUND OF THE INVENTION

Field-effect transistors (FETs) are often used for switching electrical loads on and off throughout a vehicle. A single vehicle may have several hundred FETs. The FETs are used in the activation and operation of lights, turn signals, wiper motors, video or audio systems, navigation systems, plus other various systems and devices. FETs are embedded within microcontrollers and electronic control modules. Over time and for various reasons shorts circuit conditions can arise that directly or indirectly affect the operation of the FETs. The short circuit conditions may arise, for example, due to changes in circuit connections, improper installation or repair of components, extended use of vehicle electronic systems, and degradation or deterioration in components. The short circuit conditions include "shorts" or inadvertent connections to a power source or a ground.

It has become apparent that many FETs are incapable of tolerating repeated high current caused by the short circuit conditions. High currents cause a FET to experience a rapid rise in junction temperature. This rapid rise in temperature and associated temperature differential between the junction and the rest of the silicon causes degradation to the FET. The degradation caused by the rapid rise in temperature tends to be worse at low ambient temperatures due to the larger temperature differential. When a short circuit condition exists, repeated cycling of a FET can result in damage to the FET and potentially render the FET and/or any associated electronic module coupled thereto to operate inappropriately or to be inoperative.

One known technique prevents the continued operation of a FET upon detection of a short circuit condition. The FET is switched off as quickly as possible after the short circuit is detected. Although this technique may prevent damage to the FET, it has associated disadvantages. One such disadvantage is the disablement of the FET in a false short circuit condition. A "false short circuit condition" refers to when there is a temporary spike of short duration in the operating temperature or current of a FET, which is improperly detected as a short circuit condition. Such a false condition can occur for various reasons. For example, when a capacitive or motor load is initially activated, it causes a large initial spike in current (in-rush); however, this current spike lasts for a short period of time and is considered normal. As another example, an intermittent open circuit on a capacitive/motor load can cause multiple in-rush currents that could be also detected as short circuits.

Thus, there exists a need for an improved FET short circuit intervention system that overcomes the disadvantages associated with hardware protection techniques currently in use.

SUMMARY OF THE INVENTION

In one embodiment of the present invention, a FET monitoring and protecting system is provided that includes a FET switch device. The FET switch device includes a FET, a logic device, and a feedback status output. The logic device is electrically coupled to the FET and generates a feedback status signal. A counter is incremented in response to an actual short circuit condition of the FET device. A controller is electrically coupled to the feedback status output. The controller permits the activation of the FET in response to the feedback status signal and a value of the counter.

The embodiments of the present invention provide several advantages. One advantage provided by an embodiment of the present invention is the use of a counter to record the number of short circuit events that a FET experiences and the ability to prevent activation of that FET when predetermined short circuit activation limits have been reached. This limits degradation to a FET and allows disablement of a circuit with the FET off.

Another advantage provided by another embodiment of the present invention is a system that is capable of differentiating between actual short circuit conditions and false short circuit conditions. This prevents the inadvertent disabling of FETs and thus loads activated thereby.

Yet another advantage provided by another embodiment of the present invention is a system that is capable of determining when a FET is activated due to a user-initiated request as opposed to a repeated electrical system task. This prevents a FET and an associated electronic control unit (ECU) from being disabled as a result of repeated recognition of the same or finite number of short-circuit conditions.

Still another advantage provided by another embodiment of the present invention is a system that allows for diagnostic testing of a FET switch device when a FET has been disabled due to a detected short circuit condition. This allows a technician to determine the cause of the short circuit condition.

As well, another advantage provided by another embodiment of the present invention is the prevention of FET activation once a maximum short circuit activation limit has been reached. This prevents the over heating of the FET and damage to other electrical components and devices.

The present invention itself, together with further objects and attendant advantages, will be best understood by reference to the following detailed description, when taken in conjunction with the accompanying drawing figures.

BRIEF DESCRIPTION OF THE DRAWINGS

For a more complete understanding of the invention, reference should be made to the embodiments illustrated in greater detail in the accompanying drawing figures, and also described below by way of examples of the invention, wherein.

DETAILED DESCRIPTION

Figure 1:
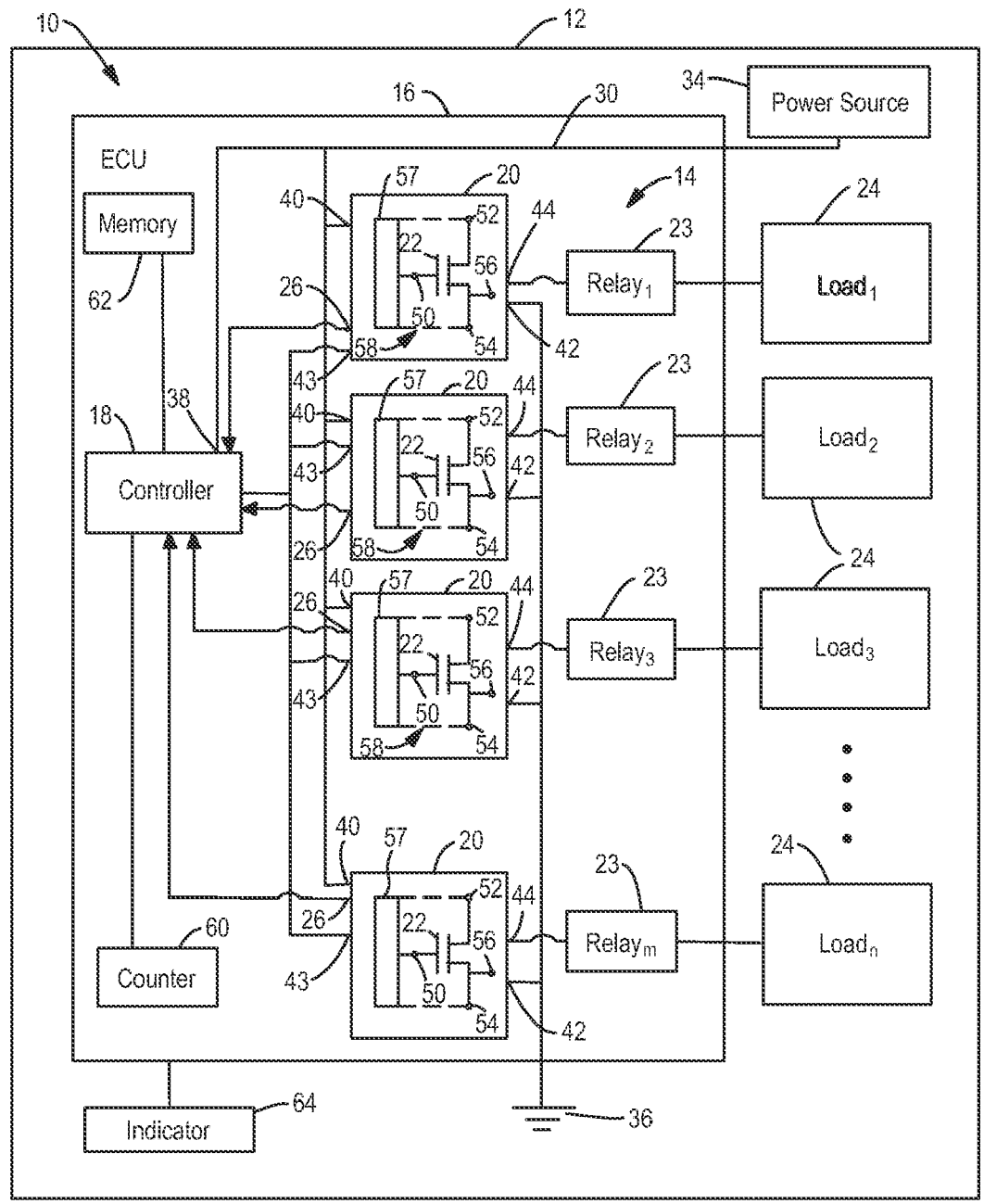
FIG. 1 is a block diagrammatic view of a FET monitoring and protecting system in accordance with an embodiment of the present invention.

In each of the following figures, the same reference numerals are used to refer to the same components. While the present invention is described primarily with respect to monitoring and protecting of FETs and FET circuits within an automotive vehicle, the present invention may be adapted to various vehicle and non-vehicle applications. The present invention may apply to automotive, aeronautical, nautical, and railway industries, as well as to other industries that utilize FETs. The present invention may be applied in commercial and non-commercial settings. Also, a variety of other embodiments are contemplated having different combinations of the below described features of the present invention, having features other than those described herein, or even lacking one or more of those features. As such, it is understood that the invention can be carried out in various other suitable modes.

In the following description, various operating parameters and components are described for one constructed embodiment. These specific parameters and components are included as examples and are not meant to be limiting.

Also, in the following description the term "vehicle electrically activated device" refers to any device within a vehicle that is electrically or electronically activated. Some examples of vehicle electrically activated devices and or systems that have vehicle electrically activated devices are headlights, turn signals, video and audio systems, navigation systems, power seat systems, power door systems, window wiper systems, electronic control modules, engine control modules, transmission control modules, brake control systems, suspension control systems, and steering control system.

Referring now to FIG. 1, a block diagrammatic view of a FET monitoring and protecting system 10 of a vehicle 12 in accordance with an embodiment of the present invention is shown. The FET system 10 includes a FET circuit 14 with an electronic control unit (ECU) 16. The ECU 16 has a controller 18 that controls operation of FET switch devices 20. Switching of FETs 22 within the FET switch devices 20 drives relays 23, which activate loads 24 attached thereto. The controller 18 monitors feedback status outputs 26 of the FET switch devices 20 and enables activation of the FETs 22 based on certain criteria described in further detail below. The controller 18 also disables the ECU 16 when one or more of the FETs 22 have reached their associated maximum short circuit activation limits.

The ECU 16 has a power line 30 and a ground line 32, which are electrically attached to a power source 34 and a vehicle ground 36, respectively. The controller 18 has a power input 38. Each of the FET switch devices 20 has a power terminal 40 and a ground terminal 42. The power input 38 and power terminals 40 are attached to and receive power from the power line 30. The ground terminals 42 are attached to the vehicle ground 36. The FET switch devices further include input control terminals 43, which receive control signals from the controller 18. The FET switch devices 20 have the feedback status outputs 26, which may be associated with one or more logic devices contained within each FET switch device 20, load outputs 44 of the FET switch devices 20, or other lines or connections contained therein or terminals thereof that may be used as status indicators.

The ECU 16 and the controller 18 may be microprocessor based such as a computer having a central processing unit (CPU), memory (RAM and/or RaM), and associated input and output (I/O) buses. The ECU 16 and the controller 18 may be application-specific integrated circuits (ASIC) or may be in the form of other logic devices known in the art. The ECU 16 and the controller 18 may be a portion of a central vehicle main control unit, an electronic control unit, an interactive vehicle dynamics module, a restraints control module (RCM), a main safety or collision controller, or may be stand-alone controllers.

The ECU 16 may have various inputs, such as sensor inputs (not shown), and various controlled outputs, such as the outputs 44. In addition to the vehicle electrically activated devices and systems mentioned above, the ECU 16 may monitor and control fuel injection systems, ignition timing, engine air intake, heating ventilation and air-conditioning (HVAC) systems, as well as other devices and systems. Although a single ECU is shown, the present invention may apply to any number of ECUs. The ECU 16 and the controller 18 may be associated with any number of the stated devices and systems.

The FET switch devices 20 may be of various types and styles. The FET switch devices 20 include the FETs 22, which each have a gate or input terminal 50, a drain terminal 52, and a source terminal 54. The gate terminals 50 may be coupled to FET switch device internal controllers and/or to other devices contained within the FET switch devices 20, as represented by logic devices 57. The gate terminals 50 and/or the logic devices 57 may be coupled to the input control terminals 43. The drain terminals 52 may be directly coupled to the power terminals 40. The source terminals 54 may be directly coupled to the ground terminals 42. The FETs 22 also have output terminals 56, which may be directly coupled to the output terminals 44. The FET switch devices 20 may include logic devices 57. Each logic device 57 may include controllers, temperature sensors, current sensors, voltage sensors, delays, programmable devices, variably adjustable devices, and other devices that may be used in determining the status of a FET switch device and the generation of a FET switch status signal. The logic devices 57 may be coupled to any of the terminals 50, 52, 54, or 56. Some FET switch device examples are provided below.

The FET switch devices 20 generate status signals, which may be sampled or received via the feedback status outputs 26 associated therewith. The feedback status signals may include temperature status signals, over current status signals, current limit status signals, current sense status signals, over voltage and under voltage status signals, and other status signals associated with the state of the FETs 22 and/or FET circuits 58 contained therein. An "FET circuit" in general refers to any circuit that includes one or more FETs. The feedback status signals may include open load signals pertaining to when a FET is in an "ON" state or pertaining to when a FET is in an "OFF" state. A few examples of FET switch devices that may be used are the VN750 high side driver and the VN920 single channel high side solid state relay by STMicroelectronics of Geneva, Switzerland, the MC33982 single intelligent high-current self-protected silicon high-side switch by Freescale Semiconductor, Inc. of Austin, Tex., and the BTS 452 R smart power high-side-switch by Infineon Technologies of Munchen, Germany. Other FET switch devices known in the art that provide feedback status output(s) may be utilized depending upon the application and the desired level of status understanding and control.

A short circuit/fault counter 60 may be included within the ECU 16, as shown, external to the ECU 16, or within the controller 18. The counter 60 is used to count and record the number of short circuit and fault detections associated with each of the FET switch devices 20. The counter 60 may count and store the number of actual short circuit detections, false short circuit detections, and fault detections. The counter 60 may also count and store the total number of actual short circuit detections, false short circuit detections, and fault detections for each FET switch device 20. The total numbers may be permanently stored in a memory 62 for later access and review either internally or externally to the FET system 10. The memory 62 may be of various types and styles known in the art. The memory 62 may include readable, writtable, resettable, unresettable, unrewritable, and uneraseable portions. The writtable and resettable portions may be directed to the number of actual short circuit detections, false short circuit detections, and fault detections between vehicle service calls or repairs associated with the ECU 16. The unresettable, unrewritable, and uneraseable portions may be associated with the total number of actual short circuit detections, false short circuit detections, and fault detections such that when predetermined maximum values are reached the ECU 16, the controller 18, and/or the FET switch devices 20 are serviced or replaced.

The memory 62 stores the stated predetermined maximum values. The memory 62 may include RAM, ROM, SRAM, DRAM, PROM, EPROM, EEPROM, NVRAM, FLASH, or any other style of memory known in the art. The memory 62 may be located within the ECU 16, as shown, within the controller 18, or external to the ECU 16.

An indicator 64 of various types and styles may be coupled to the controller 18 to provide information pertaining to a short circuit or fault condition. The indicator 64 may include LEDs, lights, displays, an instrument panel, a video system, an audio system, a heads-up display, a flat-panel display, a telematic system or other indicator known in the art.

Figure 2:
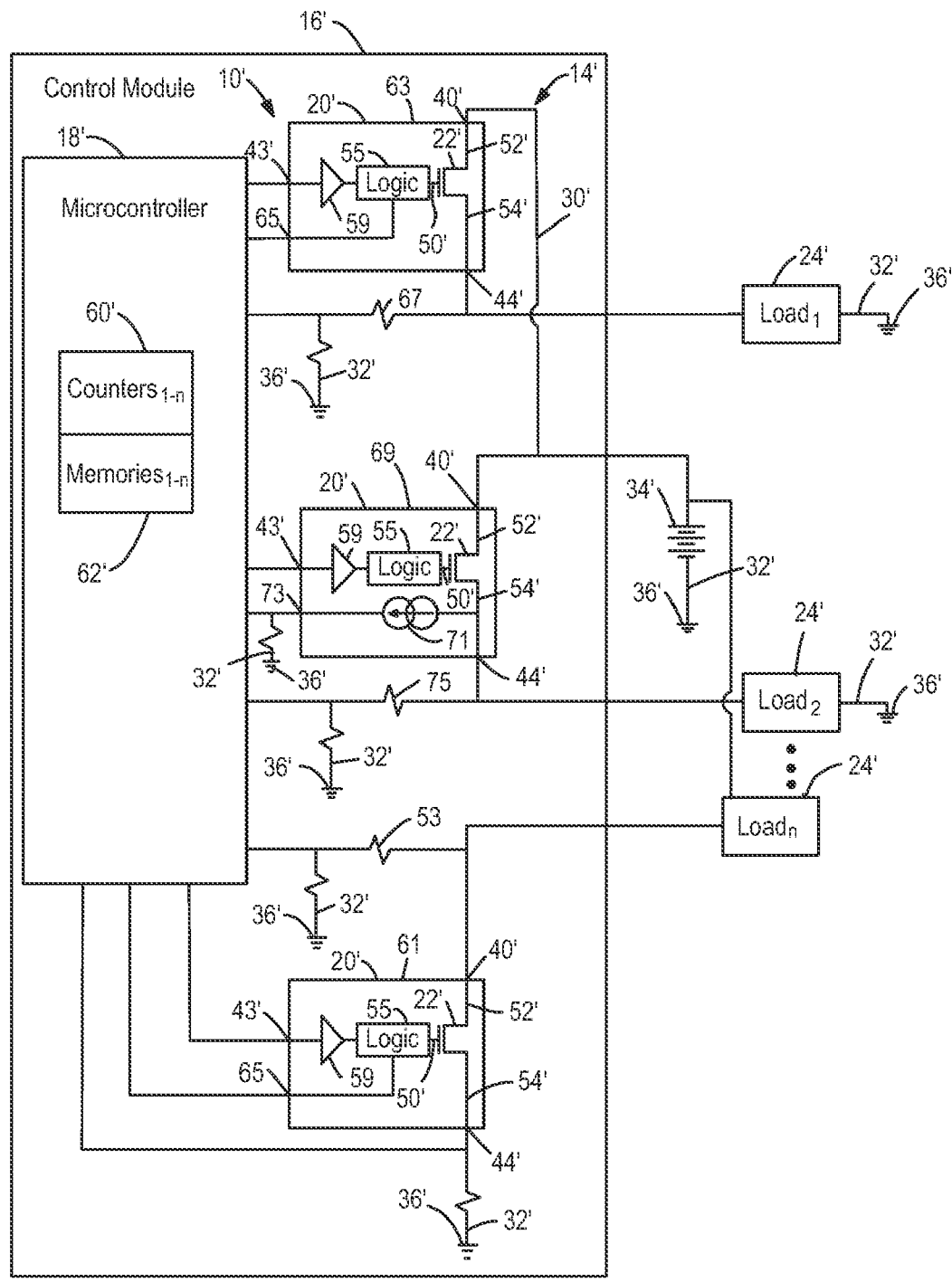
FIG. 2 is a block diagrammatic view of a FET monitoring and protecting system in accordance with another embodiment of the present invention.

Referring now to FIG. 2, a block diagrammatic view of a FET monitoring and protecting system 10' in accordance with another embodiment of the present invention is shown. The FET system 10' includes a FET circuit 14' with an ECU or control module 16', similar to the ECU 16. The ECU 16' has a microcontroller 18', similar to the controller 18, which controls operation of FET switch devices 20', similar to the FET switch devices 20. Switching of FETs 22' within the FET switch devices 20' drives the loads 24' attached thereto.

The control module 16' has a power line 30' and a ground line 32', which are electrically attached to a power source 34' and a vehicle ground 36', respectively. Each of the FET switch devices 20' has a power terminal 40' that are attached to and receive power from the power line 30'. The FET switch devices 20' further include input control terminals 43', which receive control signals from the controller 18'. The FET switch devices 20' have the feedback status outputs 26', which may be associated with one or more logic devices contained within each FET switch device 20', load outputs 44' of the FET switch devices 20', or other lines or connections contained therein or terminals thereof that may be used as status indicators.

The FET switch devices 20' include the FETs 22', which each have a gate or input terminal 50', a drain terminal 52', and a source terminal 54'. The gate terminals 50' are coupled to logic devices 55 contained within the FET switch devices 20. Inverters 59 are coupled between the input control terminals 43' and the logic devices 55 and also within the FET switch devices 20'.

The drain terminals 52' may be directly coupled to the power terminals 40' or to the output terminals 44'. Notice that the power terminal and the output terminal of the FET switch device 61 are the same terminal and are both coupled to the associated load n. The drain terminal 52' of the FET switch device 61 is coupled to the microcontroller 18' via the first resistor 53 and is also used as a feedback output for overvoltage protection. The source terminals 54' may be directly coupled to the ground terminals 42' or to the microcontroller 18'. When coupled to the microcontroller 18', the source terminals 54' are used as feedback terminals, as shown by the FET switch device 61.

The FET switch devices 61 and 63 provide illustrations of logic device feedback configurations and include logic device feedback status outputs 65, which are coupled to the microcontroller 18'. The signal on the output terminal 44' of the FET switch device 63 is also feedback to the microcontroller 18'. A second resistor 67 is coupled between the output terminal 44' of the FET switch device 63 and the microcontroller 18'.

The FET switch device 69 illustrates a current feedback configuration. The FET switch device 69 has a current supply, a current detector, or other current device 71, which is coupled between the source terminal 54' of the FET switch device 69 and the current feedback output 73. The signal on the output terminal 44' of the FET switch device 69 is also feedback to the microcontroller 18'. A third resistor 75 is coupled between the output terminal 44' of the FET switch device 69 and the microcontroller 18'.

Short circuit/fault counters 60' and memories 62' may be included within the microcontroller 18', as shown. The counters 60' and the memories 62' are similar to the counter 60 and the memory 62.

Figure 3:
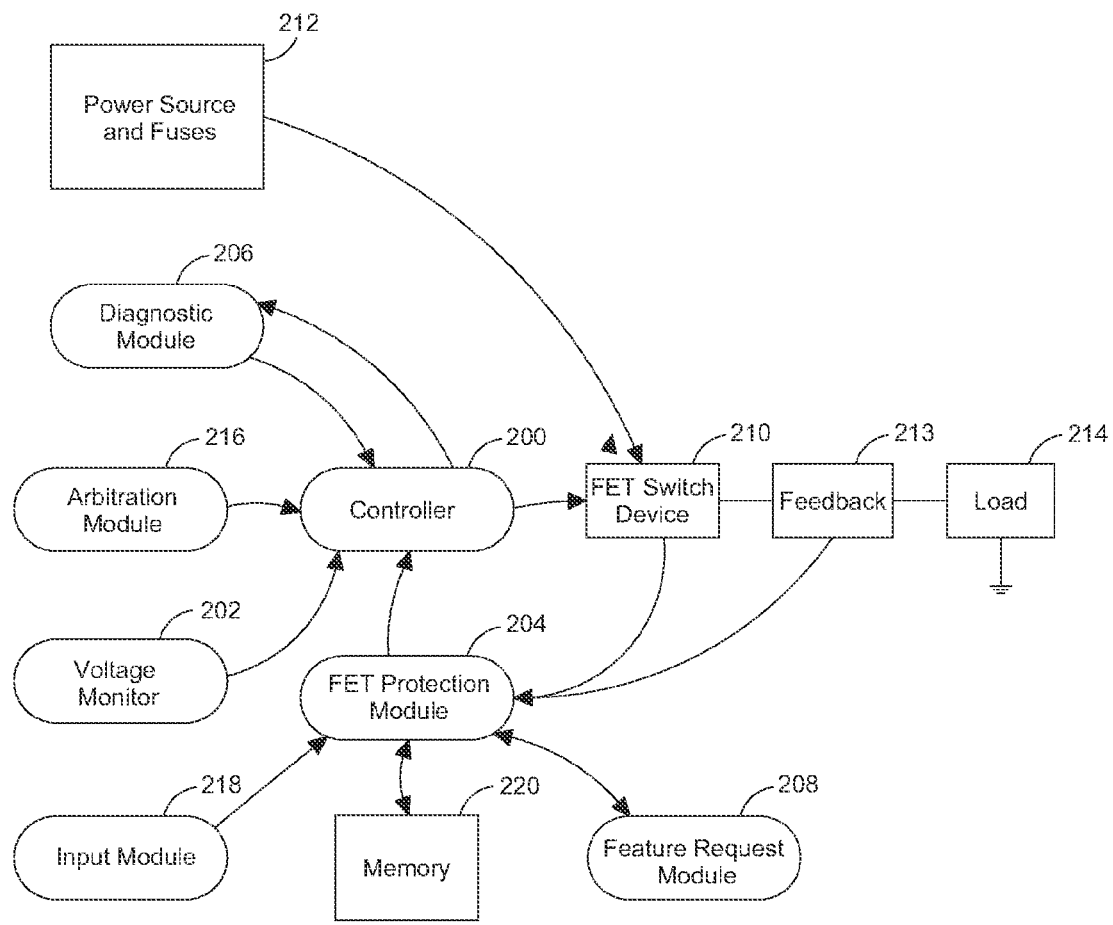
FIG. 3 is a signal flow diagram with respect to a controller performing as an output transform and in accordance with another embodiment of the present invention.

Referring now to FIG. 3, a signal flow diagram with respect to a controller 200 performing as an output transform and in accordance with another embodiment of the present invention is shown. In FIG. 3 the oval-shaped items refer to processes, which may be within software and performed by one or more of the controllers herein mentioned. The rectangular-shaped items refer to hardware. Of course, the software items may be replaced with their hardware equivalency. The controller 200 performs as an output transform that arbitrates between a voltage monitor 202, an FET protection module 204, a diagnostic request module 206, and a feature request module 208.

The controller 200 controls the operation of the FET switch device 210, which received power from the power source and fuses 212. The FET switch device 210 may be similar to one of the FET switch devices 20 and 20' described above. Feedback 213, which is downstream from or part of the FET switch device 210, is received by the FET protection module. A load 214 is coupled to the feedback 213.

The controller 200 receives protection or status signals from the FET protection module 204, command signals or output arbitration signals from arbitration module 216, voltage signals from voltage monitor 202, various inputs for retrying or reactivating an FET switch device from the input module 218, and feature request signals from the feature request module 208. The controller also receives stored information and stores information in memory 220, such FET mode information, FET short circuit count information, and DTC information. From the stated signals, inputs, and information the controller 200 controls the FET switch device 210.

Figure 4:
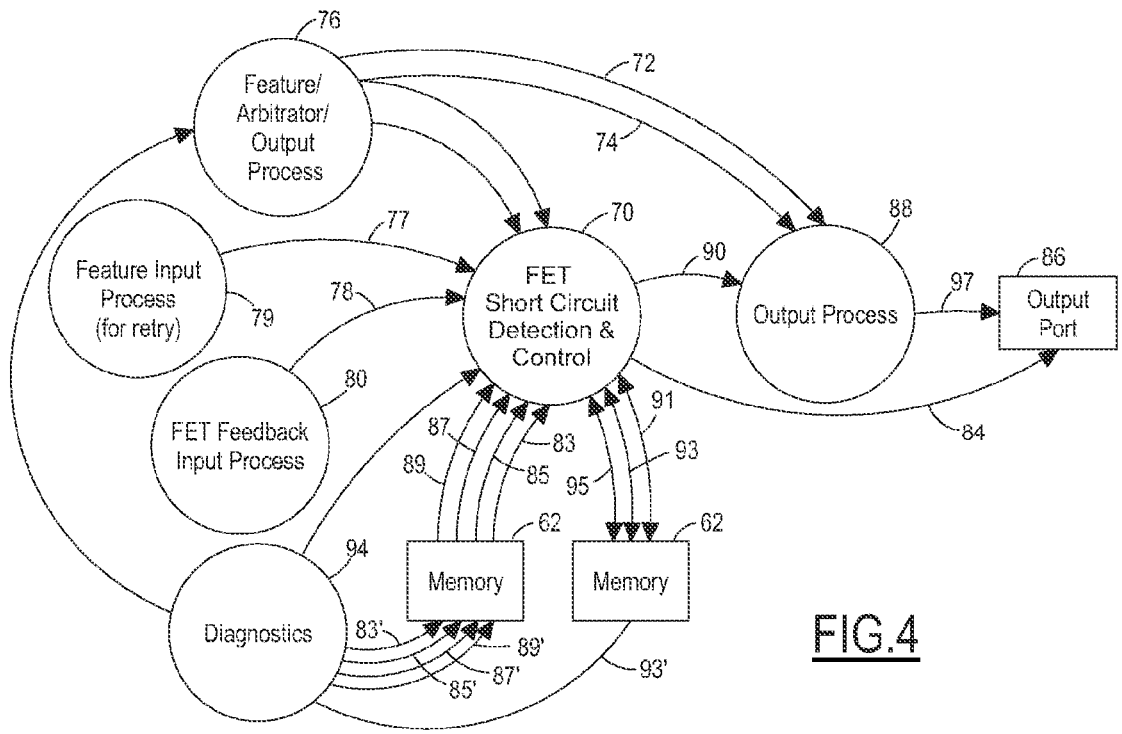
FIG. 4 is a signal flow control context diagram as associated with short circuit detection and control in accordance with an embodiment of the present invention.

Referring now to FIG. 4, a signal flow control context diagram as associated with short circuit detection and control in accordance with an embodiment of the present invention is shown. The context diagram is a signal flow diagram illustrating inputs and outputs to, from, and internal to the controller 18, which are associated with short circuit detection and control. The diagram includes a centralized FET short circuit detection and control bubble 70. The logic operations performed under the control bubble 70 are described in further detail below. The control bubble 70 receives load activation requests 72 and control signals 74, such as from a vehicle operator, which is represented by a feature, arbitrator, output process bubble 76. The load activation requests 72 refer to request to activate or turn on a load. The control signals 74 refer to how that load is activated, for example, does it receive a constant current or voltage, a pulse width modulated signal, a frequency modulated signal, or some other control signal. The control signals 74 may include signal characteristics, such as amplitude, duration, duty cycle, or other characteristics.

The control bubble also receives feature input data signals 77 from a feature input process bubble 79. Various inputs for retrying or reactivating FET switch devices may be received, processed, and used in determining whether to allow sampling or activation of the FET switch devices. In addition, the control bubble 70 receives the above-mentioned FET feedback status signals 78 from the FET switch devices 20, which is represented by a FET feedback input process bubble 80. The control bubble 70 also receives short circuit and fault count information associated with each FET switch device 20, and thus each ECU and controller coupled thereto, from the memory 62. Such information may include in-rush duration periods, disabling FET matrix values, FET protection enablement statuses, FET diagnostic test duration times, and other related information that have associated signals 83, 85, 87, and 89, respectively.

Based on the stated input requests, input signals, and received information, a determination is made with regard to which of the FET switch devices 20 are enabled and/or activated and which of the FET switch devices 20 are disabled. The terms "enable" and "disable" refer to the permitting or preventing of the activation of a device. A disable signal 84 and output port 86 are shown which represent the disablement of a FET switch device output. The FET switch activation may be performed via an output process, represented by bubble 88, which generates a control signal 97. The output process is performed by the controller 18. The output process bubble 88 also receives the load request signals 72 and the control signals 74, as well as FET protection enablement status signals 90.

A diagnostics bubble 94 is also shown and represents the diagnostics that may be performed by a diagnostic testing controller (not shown in FIG. 4). The diagnostics may be used to determine the location and cause of a short circuit or fault. A diagnostic controller may be attached to the FET system 10, incorporated into controller 18 and/or FET switch devices 20, and send signals to the ECU 16 to perform certain tasks. The diagnostic controller may receive the short circuit and fault information from the memory 62, represented by signal line 96, and may override any diagnostic trouble codes (DTCs) set by the controller 18, and perform tests so that appropriate repairs or component replacements may be done. The diagnostic controller may store or adjust information stored in the memory 62 that is used by the controller 18 in control of the FET switch devices 20. This information may include inrush duration periods, disabling FET matrix values, FET protection enablement statuses, FET diagnostic test duration times, and other related information that have associated signals 83', 85', 87', and 89', respectively. The diagnostic controller provides parameter identifications 92 to the feature output process bubble 76. The parameter identifications are used to determine how a load is to be controlled including pulse width modulation, frequency modulation, and pulse train information.

The inrush duration periods 83 and 83' refer to the amount of time that is permitted to lapse before the feedback status outputs 26 are sampled. The inrush duration periods are associated with the current inrush for the respective loads. This prevents the detection of false short circuit conditions when desired. False short circuit conditions may be detected when a load is initially activated. When a load is initially activated, there tends to be an initial spike in current, which can be detected as a short.

The disabling FET matrix values 85 and 85' may include predetermined set values at which time the associated FET switch devices 20 and/or the ECU 16 are disabled until serviced. For example, a particular FET switch device may have a predetermined $\frac{1}{3}$ short circuit activation life expectancy value, a $\frac{2}{3}$ short circuit activation life expectancy value, and a maximum short circuit activation value. When the total number of short circuits of the FET switch device is equal to the $\frac{1}{3}$ value or to the $\frac{2}{3}$ value, the FET switch device may be disabled until the short circuit condition is repaired. When the total number of short circuits of the FET switch device are equal to the maximum short circuit activation value the FET switch device and/or the ECU may be permanently disabled and replaced.

The FET protection enablement status 87 and 87' may be in the form of a memory value or flag, which has an "enabled" status and a "disabled" status. When in the enabled mode the FET switch device protection for a particular FET switch device or group of FET switch devices is activated. When in the disabled mode the FET switch device protection is deactivated. This may be used when such protection is not needed or desired, such as when a FET switch device has internal protection and shutdown capabilities.

The FET diagnostic test duration times 89 and 89' refer to the permitted time that is allotted to perform a diagnostic test. To perform a diagnostic test a FET switch device may need to be activated. To prevent the FET switch device from being damaged during the test, a limit is set on the time for which the FET switch device is activated.

The control bubble 70 also receives disable flag information, total short circuit and fault count information, and DTC information from the memory, as represented by signals 91, 93, and 95, respectively. The diagnostic bubble 94 receives the total short circuit and fault count information 93'. The control techniques associated with the control bubble 70 may store or adjust the disable flag information 91, total short circuit and fault count information 93, and DTC information 95 in the memory 62. The disable flag information 91 refers to enable/disable flags that are set when the short circuit count or fault count for certain FET switch devices is equal to the predetermined short circuit activation life expectancy values or the maximum short circuit activation values associated therewith. This allows the controller 18 to quickly determine whether a task may be performed based on the status of the disable flags, as opposed to performing any calculations or data comparisons or the like. DTCs may also be set to allow a diagnostic controller to quickly determine the location and cause of a short circuit or fault based on the information within the feedback status signals 26 and other relevant information.

Figure 5:
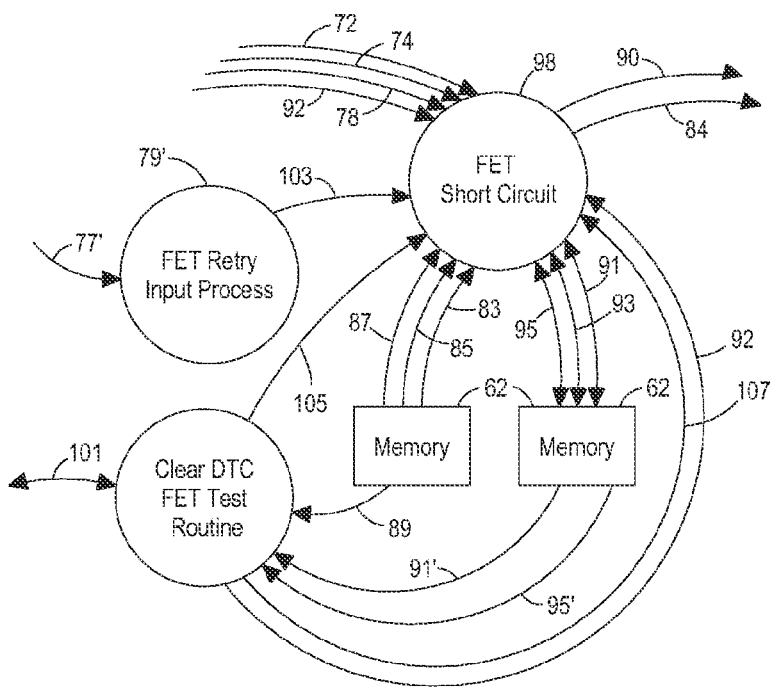
FIG. 5 is a data flow diagram for diagnostic testing of a FET circuit in accordance with an embodiment of the present invention.

Referring now to FIG. 5, a data flow diagram for diagnostic testing of a FET circuit in accordance with an embodiment of the present invention is shown. The data flow diagram is a signal flow diagram illustrating the flow of data to and from the memory 62 and the clearing of DTCs. DTCs may be cleared during or for diagnostic testing or after short circuit conditions have been repaired. The data flow diagram includes a FET short circuit bubble 98, which represents the recognition of existing and prior short circuit conditions; such knowledge is used in permitting activation of the FET switch devices 20. The FET short circuit bubble 98, like the control bubble 70, receives the request signals 72, the control signals 74, the feedback status signals 78, the inrush duration period signals 83, the disabling FET matrix value signals 85, the FET protection enablement status signals 87, the disable flag signals 91, total short circuit and fault count signals 93, and DTCs 95. The FET short circuit bubble also receives an FET reset signal 103, which when high or ON indicates that a request has been received to reset one or more FET switch devices. The FET retry input process bubble 79' receives feature input data signals 77', which are used to generate the FET reset signal 103. The FET short circuit bubble 98 also has associated outputs including the FET protection control signals 90 and the FET switch device disablement signals 84.

A clear DTC FET test routine bubble 99 is shown and refers to the process in which DTCs are reset or cleared. This process is described in detail below. The clear DTC bubble 99 receives the FET diagnostic test duration times 89, the disable flag signals 91, the DTCs 95, and the clear DTC request signals 101, such as from a diagnostic controller. The DTC bubble 99 also receives short circuit detect signal 105 from the FET short circuit bubble 98, indicating that a short or fault has been detected. The output of the DTC bubble 99 includes a DTC update signal 95', for updating the DTC records in the memory 62 and parameter identifications 103, and a FET test signal 107, indicating when an FET test is being performed. The FET test signal 107 allows FET switch devices that have reached their no retry limit to be activated for a test to allow shorts to be detected.

The above-described bubbles of FIGS. 4 and 5 may be associated with the ECU 16, the controller 18, vehicle occupant inputs, technician inputs, or inputs from other vehicle ECUs and controllers, such as the control module 16' and the microcontroller 18'.

Figure 6A:
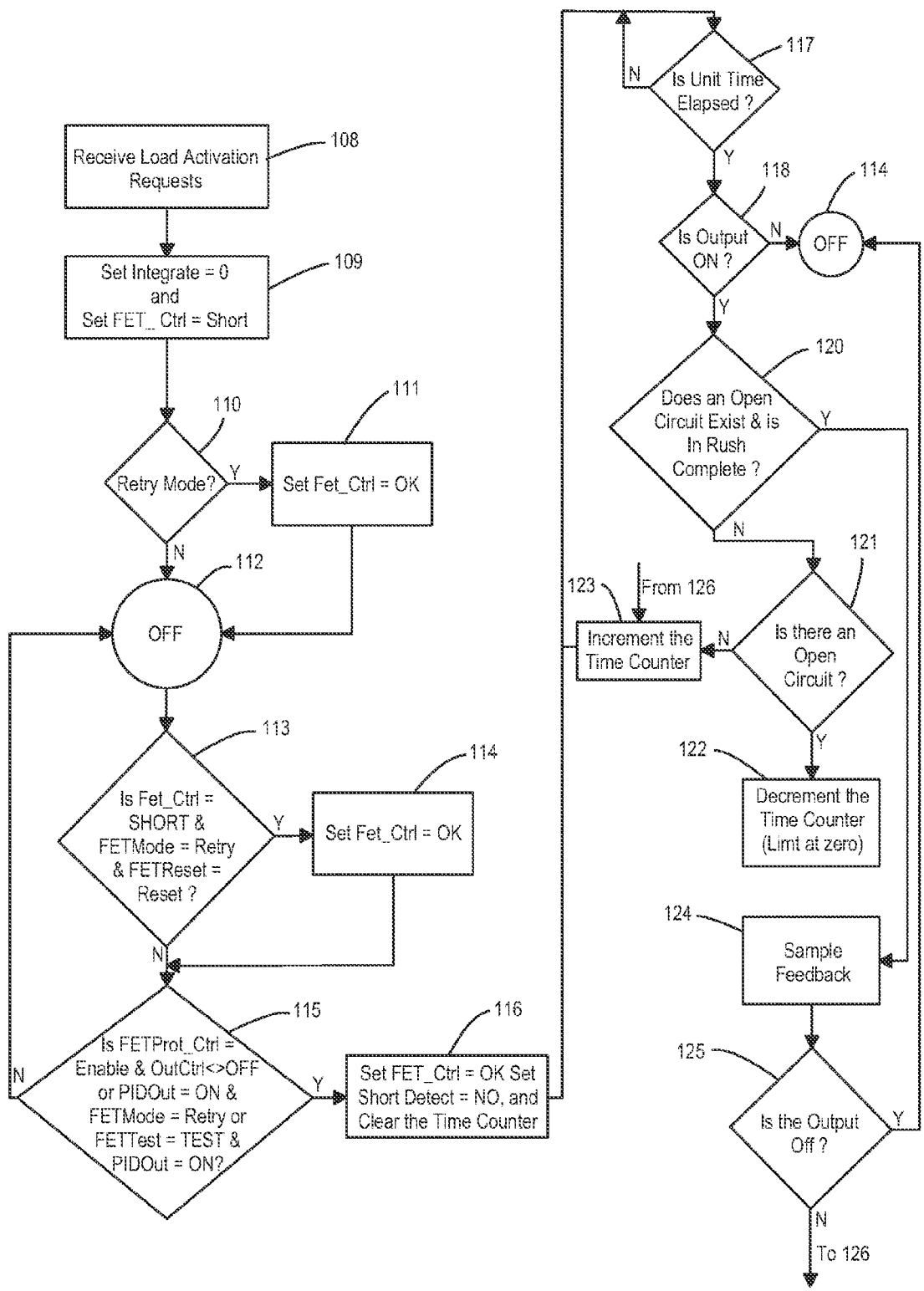
FIG. 6 is a logic flow diagram illustrating a method of monitoring and protecting FETs, FET switch devices, and FET circuits in accordance with an embodiment of the present invention.
Figure 6B:
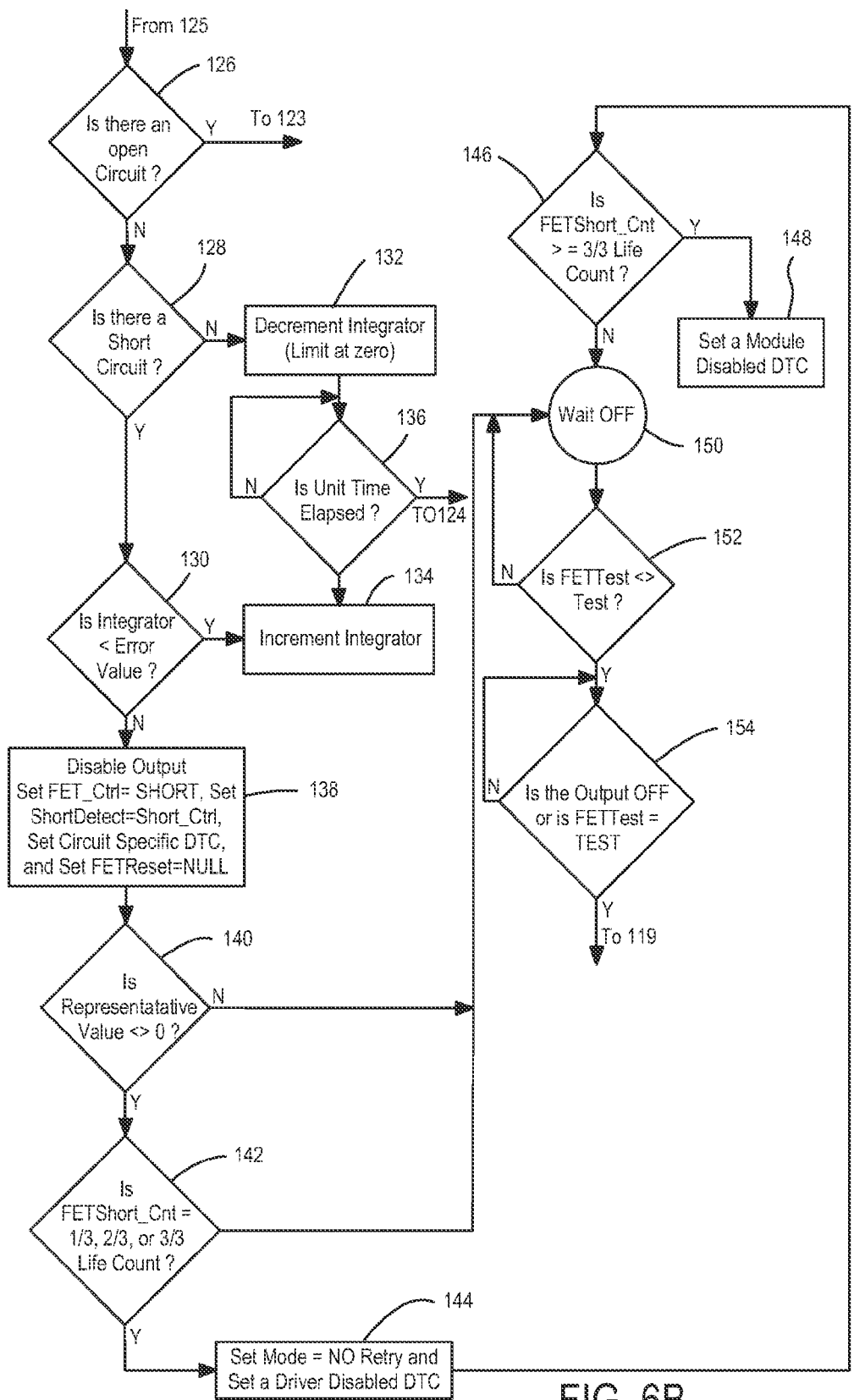

Referring now to FIG. 6, a logic flow diagram illustrating a method of monitoring and protecting FETs 22, FET switch devices 20, and FET circuits 58 in accordance with an embodiment of the present invention is shown. Although the stated method of FIG. 6 is primarily described with respect to the detection and monitoring of short circuit conditions, it may be easily modified for detection and monitoring of other fault conditions. Also, although the stated method is described primarily with respect to the embodiment of FIG. 1, it may be applied to the embodiment of FIG. 2 and may also be modified and applied to other embodiments of the present invention.

In step 108, load activation requests are received by the controller 18. The load activation requests may be initiated by a vehicle occupant, a technician, or via an electronic device external or internal to the ECU 16.

In step 109, a feedback status signal value or representative feedback status signal value, referred to as "integrate", is set equal to zero. An FET control flag (FET_Ctrl) is set equal to SHORT.

In steps 110, 113, and 115, the controller 18 determines whether FET status flags or DTCs are set or some other indication is provided that a short circuit condition or fault exists and has previously been detected for the associated FET switch devices requested for activation. A FET status flag indicates whether the controller 18 is permitted to proceed with the sampling of the feedback status outputs 26. When the FET status flag is set to "No-Retry" the feedback status output is not sampled. When the FET status flag is set to "Retry" than the feedback status output may be sampled. When a DTC is currently set or the like the controller 18 proceeds to step 112, otherwise the controller proceeds to steps 113 and 115. Thus, in steps 110, 113, and 115 when a retry mode is present the FET control flag is set equal to OK, else the controller 18 proceeds to step 112. In step 112, the controller 18 may indicate that a short circuit condition or fault exists. In step 113, the controller 18 also checks if the FET control flag is set to SHORT and the FET reset flag (FETReset) is set, indicating that a short has been detected and that an operator or other control mechanism has requested activation of the associated FET switch device. When the FET control flag is set to SHORT and the FET reset flag is set the controller 18 proceeds to step 114, otherwise to step 115. In step 115, the controller 18 checks if the FET protection control flag (FETProt_Ctrl) is enabled, if the FET output control (Output_Ctrl) is ON, if the diagnostic request flag (PIDOut) is ON, and/or if an FET test flag (FETTest) is ON and proceeds to steps 112 or 116 accordingly. When the FET output control flag is ON the associated FET switch device(s) are enabled and placed in an ON state, which drives the corresponding load(s). When FET protection control flag is enabled and the output control is ON or when the diagnostic request flag is ON and the FET mode is set to "RETRY" or when the FET test flag is set to "TEST" and the diagnostic request flag is ON the controller proceeds to step 116, otherwise the controller performs step 112

In step 116, the controller 18 sets the FET control flag equal to OK, the FET control flag or other short detection variable equal to NO, and clears a delay time counter.

In step 117-122, prior to sampling the feedback status outputs 26 of the FIT switch devices 20, the controller 18 delays for a predetermined delay period of time. This is referred to as the "in rush". This minimizes the detection of false short circuit conditions. Of course, should there be an instance when sampling is desired of the feedback status signals during this initial period the delay may be overridden. In step 117, the controller waits a unit of time. An algorithm may be executed every n msec. In step 118, when the FET output control is ON the controller proceeds to step 120, otherwise the controller stops performing the given routine. In another embodiment, when the FET output control flag is set to OFF and the diagnostic request flag is not set to On or the output request flag is not set to OFF and the diagnostic request flag is set to OFF the controller 18 proceeds to step 120.

In step 120, when there is no open circuit and the in rush is completed the controller proceeds to step 124, otherwise to step 121. The controller compares the current delay time on the delay time counter with the predetermined delay time. When the predetermined delay time has elapsed the controller proceeds to step 124. In step 121, when an open circuit exists the controller proceeds to step 122, otherwise to step 123. In step 123 the delay time counter is incremented, whereas in step 122 the delay time counter is decremented.

In steps 124-136, the controller 18 checks for a short circuit or fault condition. The short circuit or fault condition may be associated with one or more of the FET switch devices 20 and may be external to or both external to and internal to the FET switch devices 20. In step 124, the controller 18 samples the feedback status outputs 26 for a predetermined sampling period and generates a representative feedback status value. In step 125, when the FET output control is OFF and the diagnostic request flag is ON or the output request flag is not set to OFF and the diagnostic request flag is set to OFF then the controller proceeds to step 119, otherwise to step 126. In step 126, when an open circuit condition is detected the controller 18 proceeds to step 123, otherwise to step 128.

In step 128, the controller 18 checks whether a short circuit condition exists. An average feedback status signal value is determined in response to the sampled feedback status signals. The average value is provided as the representative value. When a short circuit is present the controller proceeds to step 130, otherwise to step 132. In steps 130, when the representative value is greater than or equal to the predetermined error value the controller 18 proceeds to step 134, otherwise to step 138. In step 134, the controller 18 increments or increases the representative value. In step 132, the controller decrements or decreases the representative value for each negative comparison or for each sample that is less than the predetermined error value. Upon completing steps 132 and 134 the controller proceeds to step 136 and waits a unit elapsed time, much like in step 109 and then proceeds to step 122.

In one embodiment of the present invention, the increases in step 134 are weighted more than the decreases in step 132 such that for each positive comparison the average value is increased, for example by thirteen (13) and for each negative comparison the average value is decreased by one (1). This emulates the cooling effect of the components. In another embodiment, the controller 18 is configured to detect four bad samples within 16 samples, thus, indicating a short circuit condition. Of course, other techniques may be used in determining the representative value.

Steps 128-134 may also be used to prevent repeated short circuit or fault detections of non-user initiated load activation requests. For example, when a turn signal is activated, the first ON state of the turn signal light may cause the detection of a short circuit condition when such exists. Each turn signal light illumination thereafter that is associated with the single user request is not interpreted as an additional short. Thus, the total number of short circuit activation detections for a particular FET switch device is not incremented more than once for each user-initiated request. The controller 18 in performing such action uses timing information for that turn signal.

For each FET output there is an associated short circuit protection strategy and a defined DTC that is supported by the controller 18 or the ECU 16. Circuit specific DTCs may be aged one time per vehicle ignition when the associated load is activated and a short does not exist with that load. Circuit specific DTCs are not aged when a short exists.

In step 138, the controller performs multiple tasks. The FET switch devices, upon which a short circuit condition or fault has been detected, are disabled. The short circuit/fault flag is set to SHORT when a short circuit condition is detected and to FAULT when some other fault is detected. The controller 18 increments the appropriate total number of short circuit or fault condition values, referred to as FETShort_Cnt, associated with the FET switch devices in which a short circuit condition or the like was detected. The controller also sets a circuit specific DTC and sets the reset flag to null.

In step 140, when the representative value is not equal to zero the controller 18 proceeds to step 142, otherwise to step 150. In step 142, the controller compares a FET short count values (FETShort_Cnt), associated with the total number of actual short circuit conditions for each FET switch device, with a one-third life value, a two-third life value, and a three-third life value associated therewith. The three-third life value is a maximum value that may be equal to a life expectancy value, a predetermined maximum value that is less than the maximum life expectancy value, or some other similar value. When a FET short count value is equal to one of the one-third life value, two-third life value, or three-third life value, the controller proceeds to step 144, otherwise to step 150.

In step 144, the appropriate FET switch devices are disabled. The FET switch devices remain disabled until the associated short circuit conditions are repaired and the short circuit/fault flag is reset to a "Null" state. In one example embodiment, when a FET switch device 20 experiences a total number of actual short circuit detections that is equal to a maximum short circuit activation number the FET switch device is replaced, which may include replacing the ECU 16. The FET status flag may be set to No-Retry for the FET switch devices that are disabled. Also, a DTC may be set for the FET switch devices or drivers that are disabled. A DTC may also be set for other related reasons. For example, a DTC may be set that indicates where a short circuit condition exists or may exist based on the FET switch devices that have been determined to be in a short circuit condition.

In step 146, when the FET short count value is equal to the three-thirds life value or greater then step 148 is performed, otherwise step 150 is performed. In step 148, a DTC may be set for the ECU. The ECU 16 that is associated with the FET switch devices that have reached their maximum life expectancy is disabled. This prevents damage to the FET switch devices, the ECU 16, the controller 18, and any circuitry attached thereto. The ECU 16 may remain disabled until the FET switch devices are replaced and/or the ECU 16 is replaced.

In step 150, the wait period is over and the FET switch devices are maintained in their current state, depending upon the determinations of steps 140, 142, and 146. When the determinations in steps 140, 142, and/or 146 are negative the FET switch devices are maintained in an enabled mode and the corresponding loads are also maintained in an ON state, otherwise they are maintained in a disabled state. In step 152, the controller 18 waits until the FET test routine is complete before attempting to detect another short circuit condition. In step 154, when the output of the FET switch device(s) of concern are disabled and a new FET test request flag is High the controller returns to step 101, to step 119, or when a diagnostic test is requested the controller 18 may proceed to step 158. Continuation to step 119 is shown.

Figure 7:
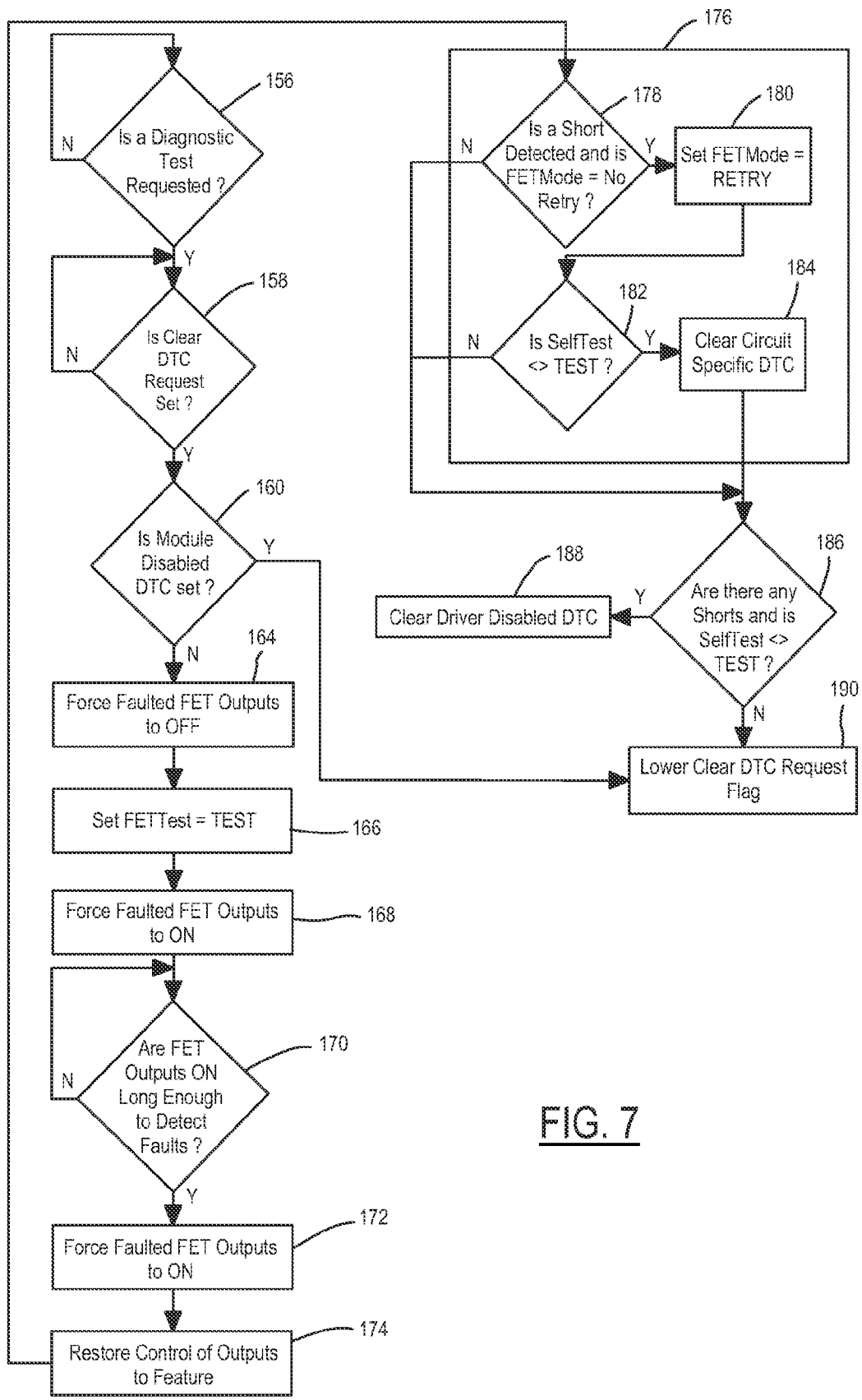
FIG. 7 is a logic flow diagram illustrating a method of clearing a diagnostic trouble code in accordance with an embodiment of the present invention.

Referring now to FIG. 7, a logic flow diagram illustrating a method of clearing a diagnostic trouble code in accordance with an embodiment of the present invention is shown.

In step 156, when a diagnostic test is requested the controller proceeds to step 158. In step 158, when the controller 18 receives a diagnostic test request or a request to clear a DTC, the controller 18 proceeds to step 160, otherwise the controller 18 performs no additional action. A diagnostic test flag may be set to "Clear" when a request has been received indicating such a request. In step 160, when module DTC has been set, thus indicating that a FET switch device has reached the maximum value of faults, the controller 18 proceeds to step 190, otherwise to step 164. This prevents, for example, activation of FET switch devices that have reached their life expectancy.

In step 164, FET switch devices associated with an ECU 16 under test are disabled. In step 166, a FET test mode is activated. In step 168, the outputs of the FET switch devices that are affected by a particular short circuit or fault condition associated with a particular DTC are activated.

In step 170, the controller 18 delays a predetermined FET test duration before proceeding to step 172. This provides time needed to detect any faults. In step 172, FET test mode is disabled or set equal to NULL. In step 174, normal control of the FET switch devices is restored.

In step 176, the controller 18 determines whether a DTC is present and whether a self-test is being performed for each FET switch device. In step 178, the controller 18 determines whether a DTC is present due to a short circuit condition. When the short circuit/fault flag is set and the FET status flag is set to No-Retry the controller 18 proceeds to step 180, otherwise step 186 is performed. In step 180, the FET switch devices are left in an enabled mode or are enabled and the FET status flag is set to Retry.

In step 182, the controller 18 determines whether the test being performed is a self-test. When a self-test is being performed the controller 18 proceeds to step 184, otherwise the controller 18 proceeds to step 186. A self-test refers to when the controller 18 or some other controller within the vehicle 12 initiates and performs a test on one or more of the electrical or electronic systems and components within the vehicle 12. In step 184, the FET specific DTCs are cleared. Upon completing step 184 the controller 18 proceeds to step 186.

In step 186, the controller 18 determines whether the short circuit or fault conditions have been repaired and thus no longer exist. When the short circuit and fault conditions have been repaired, the short circuit/fault flag has been set to null, and a self-test is not being performed then the controller 18 proceeds to step 188, otherwise the controller proceeds to step 190.

In step 188, the controller 18 clear the driver disabled DTCS. In step 190, the DTC test procedure flag is set to null indicating that the test is completed.

The present invention provides reliable techniques for detecting short circuit conditions and faults and preventing damage to FETs, FET switch devices, and FET circuits. The present invention uses and properly samples FET switch device feedback status signals, which increases controller awareness of system status and allows for accurate short circuit detection.

While the invention has been described in connection with one or more embodiments, it is to be understood that the specific mechanisms and techniques which have been described are merely illustrative of the principles of the invention, numerous modifications may be made to the methods and apparatus described without departing from the spirit and scope of the invention as defined by the appended claims.

What is claimed is:

1. A system for monitoring and protecting a field-effect transistor (FET), said system comprising:
    a FET switch device including a FET having a plurality of terminals, a logic device coupled to at least one of said terminals of said FET and operable to generate a feedback status signal associated with the operational condition of said FET, and a feedback status output associated with said logic device and adapted for communicating said feedback status signal;
    a counter operable to keep a first updatable count that is incremented only in response to an actual short-circuit condition experienced by said FET, a second updatable count that is incremented only in response to a false short-circuit detection and at least a third updatable count that is incremented only in response to a fault detection;
    a controller with memory coupled to said feedback status output of said FET switch device and also said counter; and
    a diagnostic testing control module for being coupled to said controller with memory;
    said controller is operable to monitor both said feedback status signal and the first, second, or third count of said counter and selectively permit activation of said FET according to said feedback status signal and said first, second, or third count of said counter; and
    said diagnostic testing control module is operable to obtain short-circuit count information from said controller with memory.

2. A system as set forth in claim 1, wherein said feedback status signal includes at least one type of signal selected from the group consisting of a temperature status signal, an over current status signal, a current sense status signal, and a voltage status signal.

3. A system as set forth in claim 1, wherein said feedback status signal is associated with the operational condition of at least one of a gate terminal of said FET, a drain terminal of said FET, and a source terminal of said FET.

4. A system as set forth in claim 1, wherein said FET switch device is a single integrated solid-state circuit.

5. A system as set forth in claim 1, wherein said counter is included with said controller.

6. A system as set forth in claim 1, wherein said controller is operable to prevent activation of said FET when said first or third count of said counter is equal to a predetermined number.

7. A system as set forth in claim 1, wherein said controller is operable to prevent activation of said FET when said first or third count of said counter is equal to one of a plurality of predetermined numbers.

8. A system as set forth in claim 1, wherein said controller is operable to permanently prevent activation of said FET when said first or third count of said counter is equal to a maximum short circuit activation number.

9. A system as set forth in claim 1, wherein said count of said counter is incremented in response to said actual short-circuit condition also being a user-initiated action.

10. A system as set forth in claim 1, wherein said count of said counter is not incremented in response to a false short-circuit condition.

11. A system as set forth in claim 1, wherein first, second or third said count of said counter is not incremented in response to a repeated vehicle system initiated action.

12. A system as set forth in claim 1, wherein said controller is operable to increment said first, second or third count of said counter in response to said feedback status signal.

13. A system as set forth in claim 1, wherein said system further comprises a status signal sampler that is operable to generate an average status signal in response to received samples of said feedback status signal, and said controller is operable to prevent activation of said FET in response to said average status signal.

14. A system as set forth in claim 13, wherein said system further comprises an in-rush delay device, and said status signal sampler is operable to generate said average status signal after a predetermined delay set by said in-rush delay device.

15. A system as set forth in claim 13, wherein said status signal sampler is operable to increase said average status signal when a short-circuit equivalent condition exists and alternatively decrease said average status signal when a short-circuit equivalent condition does not exist.

16. A system for monitoring and protecting electronics onboard a vehicle, said system comprising:
    (a) an electrically activatable vehicle load;
    (b) an electronic control unit (ECU) comprising:
    (i) a FET switch device including a FET having a plurality of terminals, a logic device coupled to at least one of said terminals of said FET and operable to generate a feedback status signal associated with the operational condition of said FET, a load output associated with at least one of said terminals of said FET and coupled to said vehicle load, and a feedback status output associated with said logic device and adapted for communicating said feedback status signal;

(ii) a counter operable to keep a first updatable count that is incremented only in response to an actual short-circuit condition experienced by said FET, a second updatable count that is incremented only in response to a false short circuit condition experienced by said FET, and at least a third updatable count that is incremented only in response to a fault detection condition experienced by said FET; and (iii) a controller with memory coupled to said feedback status output of said FET switch device and also said counter; and (c) a diagnostic testing control module for being coupled to said controller with memory;

wherein said controller is operable to monitor both said feedback status signal and the first, second or third count of said counter and selectively permit activation of said FET according to said feedback status signal and said first, second or third count of said counter; and wherein said diagnostic testing control module is operable to obtain short-circuit count information from said controller with memory.

17. A system as set forth in claim 16, wherein said controller is operable to disable said ECU according to said feedback status signal and also said first, second or third count of said counter.

18. A method of monitoring and protecting a FET circuit, said method comprising the steps of: operating a logic device coupled to said FET circuit so as to generate a feedback status signal according to the operational state of a FET included in said FET circuit;

operating a counter so as to count a first number of occurrences that said FET in said FET circuit experiences a short-circuit condition;

operating the counter so as to count a second number of occurrences that said FET in said FET circuit experiences a false short-circuit condition;

operating the counter so as to count at least a third number of occurrences that said FET in said FET circuit experiences a fault detection condition;

operating a controller with memory so as to selectively permit activation of said FET according to said feedback status signal and said first, second and at least third number of occurrences as counted; and coupling a diagnostic testing control module to said controller with memory so as to obtain short-circuit count information from said controller with memory.

19. A method as set forth in claim 18, said method further comprising the steps of:

operating said controller with memory so as to detect at least one actual short- circuit condition in response to said feedback status signal and said number of occurrences as counted;

operating said controller with memory so as to set at least one diagnostic trouble code (DTC) in response to the detection;

operating said controller with memory so as to disable said FET;

curing each said at least one actual short-circuit condition;

resetting said diagnostic trouble code with either said diagnostic testing control module or said controller with memory; and re-enabling said FET with either said diagnostic testing control module or said controller with memory.

20. A method as set forth in claim 19, said method further comprising the steps of:

permitting the resetting of said diagnostic trouble code and the re-enabling of said FET until the counted number of occurrences equals a predetermined maximum short-circuit activation limit; and replacing said FET circuit that includes said FET when said counted number of occurrences equals said predetermined maximum short-circuit activation limit.

* * * * *